(12) United States Patent
Broekaart

(10) Patent No.: US 9,953,855 B2
(45) Date of Patent: Apr. 24, 2018

(54) PROCESS FOR TRANSFERRING LAYERS

(71) Applicant: Soitec, Crolles (FR)

(72) Inventor: Marcel Broekaart, Theys (FR)

(73) Assignee: Soitec, Bernin (FR)

( * ) Notice: Subject to any disclaimer, the term of this patent is extended or adjusted under 35 U.S.C. 154(b) by 157 days.

(21) Appl. No.: 14/938,492

(22) Filed: Nov. 11, 2015

(65) Prior Publication Data
US 2016/0141198 A1    May 19, 2016

(30) Foreign Application Priority Data

Nov. 14, 2014 (FR) .................... 14 02610

(51) Int. Cl.
| | | |
|---|---|---|
| H01L 21/683 | (2006.01) | |
| H01L 21/18 | (2006.01) | |
| H01L 21/78 | (2006.01) | |
| H01L 21/02 | (2006.01) | |

(52) U.S. Cl.
CPC ........ H01L 21/6835 (2013.01); H01L 21/185 (2013.01); H01L 21/7806 (2013.01); *H01L 21/02002* (2013.01); *H01L 2221/6834* (2013.01); *H01L 2221/68313* (2013.01); *H01L 2221/68327* (2013.01); *H01L 2221/68363* (2013.01)

(58) Field of Classification Search
CPC combination set(s) only.
See application file for complete search history.

(56) References Cited

U.S. PATENT DOCUMENTS

| | | | |
|---|---|---|---|
| 8,530,334 B2 | 9/2013 | Lagahe et al. | |
| 2010/0248447 A1* | 9/2010 | Nishihata | H01L 21/26533 438/459 |
| 2011/0189834 A1* | 8/2011 | Castex | H01L 21/31053 438/455 |

FOREIGN PATENT DOCUMENTS

| | | |
|---|---|---|
| FR | 2926671 A1 | 7/2009 |
| JP | 11297972 A | 10/1999 |

* cited by examiner

*Primary Examiner* — Ratisha Mehta
(74) *Attorney, Agent, or Firm* — TraskBritt

(57) ABSTRACT

The invention relates to a process for transferring an active layer to a final substrate using a temporary substrate, the active layer comprises a first side having a three-dimensional surface topology, the process comprising: a first step of bonding the first side of the active layer to one side of the temporary substrate; a second step of bonding a second side of the active layer to the final substrate; and a third step of separating the active layer and the temporary substrate; the process being characterized in that the side of the temporary substrate possesses a surface topology complementary to the surface topology of the first side of the active layer, so that the surface topology of the temporary substrate encapsulates the surface topology of the first side of the active layer in the bonding first step.

20 Claims, 3 Drawing Sheets

PROCESS FOR TRANSFERRING LAYERS

CROSS-REFERENCE TO RELATED APPLICATION

Pursuant to 35 U.S.C. § 119(a), this application claims the benefit of the filing date of French Patent Application No. 1402610, which was filed Nov. 14, 2014 in the name of Marcel Broekaart, the entire contents of which are incorporated herein in their entirety by this reference.

TECHNICAL FIELD

The invention relates to a process for transferring an active layer comprising a particular surface topology.

BACKGROUND

The fabrication of such a layer increasingly involves techniques for transferring layers of various thicknesses from one carrier to another.

In many applications in the field of microelectronics, it may be desired to transfer what is called an "active layer," for example, integrating electrical components, to a substrate, or a semiconductor layer present on the surface of a first substrate to a second substrate.

The active layer, as understood in the context of the present invention, cannot for reasons of its dimensions, especially its thickness, and its fragility, be considered to be self-supporting.

Thus, in order to transport the active layer, and in particular transfer it to a final substrate, it is necessary to securely fasten it to a transfer substrate referred to as a "handle substrate" or a "temporary substrate." Such a temporary substrate then allows a layer that needs to be moved and/or transferred to be handled.

It may prove to be difficult to transfer the active layer to the final substrate using a temporary substrate because a first side of the active layer comprises electronic components, such as circuits and contact pads, commonly referred to as "bond pads," forming a non-uniform three-dimensional surface topology specific to the first side of the active layer. This surface topology makes it difficult to securely fasten the temporary substrate to the first side of the active layer.

Prior-art solutions allowing the first side of an active layer, the surface topology of which is not planar, to be bonded to a temporary substrate consist in leveling and/or planarizing the side of the active layer, so as to obtain a regular surface topology suitable for bonding, for example, direct bonding. However, these methods are subject to drawbacks and difficulties with implementation.

One known solution, described in French Patent 2926671 A1, consists in forming a layer of adhesive material on the active layer, and especially on the side of the active layer having an irregular surface topology, so that the layer of adhesive material planarizes the surface topology of the active layer, with the objective of bonding the active layer to the final substrate by way of the layer of adhesive material. The drawback of this solution is that it is necessary to add a layer, increasing complexity of the process and increasing its production cost. Moreover, the layer of adhesive material makes contact with the electrical components forming the surface topology of the active layer. This contact may damage the elements.

Another solution, described in document JP11-297972, consists in covering the electrical components with a plurality of layers placed one on top of the other, the last of which is etched in order to obtain a desired level of planarity for a bonding step. Thus, this etching step may generate contamination and stress in the structure. Moreover, the electrical components also make direct contact with the first layer, possibly damaging them. Lastly, this solution requires as many deposition processes as there are deposited layers, making the process complex and expensive to implement.

The addition of layers, described in the aforementioned known prior-art solutions, moreover contributes to increasing the number of heat treatments required to stabilize and/or reinforce the bonding of these layers to a carrier. Thus, these solutions increase the thermal budget of production processes, possibly weakening or damaging certain electrical elements and increasing the cost of these production processes.

Moreover, and depending on the production processes of a desired structure, the addition of these layers complicates access, in subsequent fabrication steps, to the side of the active layer on which the added layers are placed.

The known prior-art solutions require various types of treatment on at least one side of the active layer in order to make it sufficiently planar for bonding. Depending on the type of treatment implemented, contaminants or applied strains contribute to decreasing the quality and operational performance of the active layer.

BRIEF SUMMARY

The present disclosure aims to mitigate these limitations of the prior art by providing a process for transferring an active layer to a final substrate using a temporary substrate, the active layer comprises a first side having a three-dimensional surface topology, the process comprising:
- a first step of bonding the first side of the active layer to one side of the temporary substrate;
- a second step of bonding a second side of the active layer to the final substrate; and
- a third step of separating the active layer and the temporary substrate.

The process according to the invention is noteworthy in that the side of the temporary substrate possesses a surface topology complementary to the surface topology of the first side of the active layer, so that the surface topology of the temporary substrate encapsulates the surface topology of the active layer in the bonding first step.

Implementing the process in this way allows the first side of the active layer to be bonded to the side of the temporary substrate without the active layer undergoing any treatment or modification, thus preventing contamination or needless strains. Moreover, the encapsulation of the surface topology of the active layer by the complementary surface topology of the temporary substrate allows the electrical components placed on the active layer to be protected, thus preventing any contact.

BRIEF DESCRIPTION OF THE DRAWINGS

The invention will be better understood in light of the following description of particular and non-limiting embodiments thereof, given with reference to the appended figures in which.

DETAILED DESCRIPTION

A plurality of possible embodiments of the transferring process according to the invention, and allowing the aforementioned problems to be mitigated, will now be described with reference to FIGS. 1 to 4. Elements common to the various representations of the active layer and of the temporary substrate are referenced with the same reference numbers.

Figure 1:
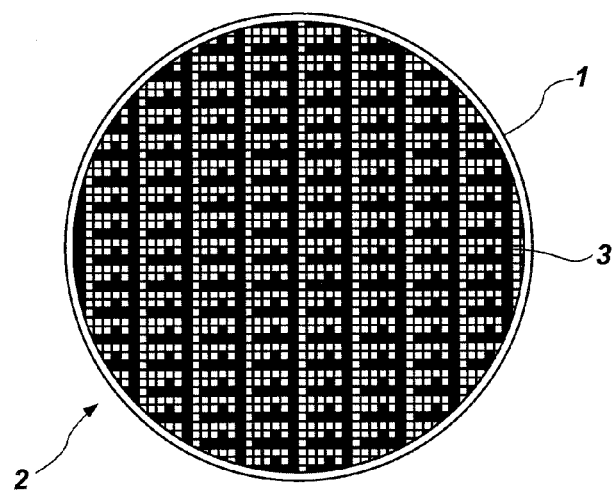
FIG. 1 is a plan view of one side of an active layer according to the present disclosure.

FIG. 1 is a plan view of a first side 1 of an active layer 2 on which are placed electrical components 3, such as electronic circuits and contact pads. By way of non-limiting example, the active layer 2 may be made of silicon, AlN, plastic, glass, etc. The number of electrical components and the distances separating them from each other are set depending on the desired functionalities of the active layer 2 and on the fabrication process. Thus, the electrical components 3 form a three-dimensional surface topology of the first side 1 of the active layer 2. The three-dimensional surface topology of the first side 1 of the active layer 2 then comprises at least one nonplanar portion, defined by the electrical components, and a planar portion, as illustrated in FIG. 3.

The nonplanar portion may also result from a particular treatment, or from the deposition of components that are not necessarily electrical.

Figure 3:
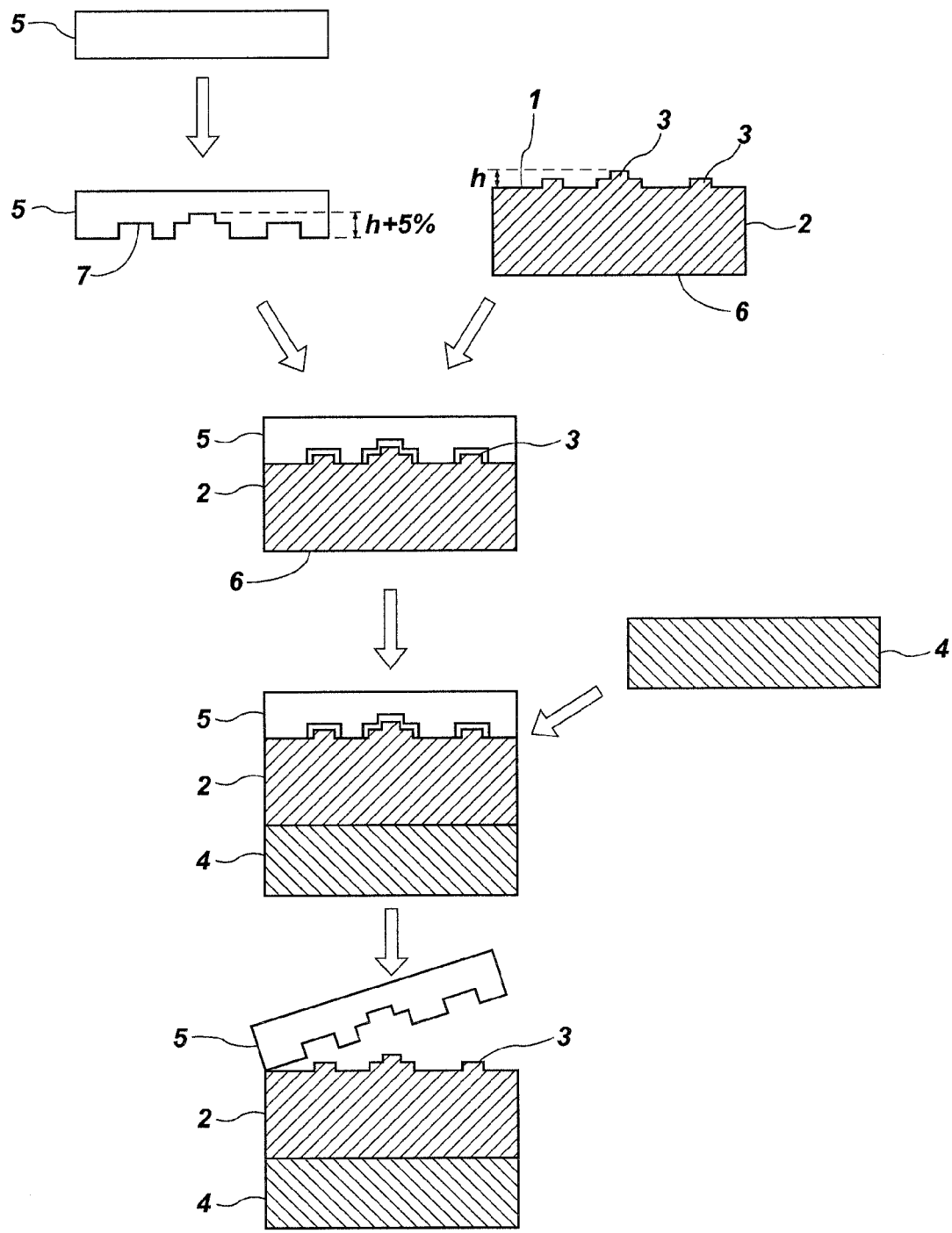
FIG. 3 is a schematic representation of the transferring process according to the present disclosure.

FIG. 3 schematically shows, step by step, a transferring process according to the present disclosure, this process comprising transferring an active layer 2, such as the active layer 2 illustrated in FIG. 1, to a final substrate 4 by bonding one side of the final substrate 4 to a second side 6 of the active layer 2. The active layer 2 is transferred using a temporary substrate 5, the first side 1 of the active layer 2 being bonded, in a first bonding step, to one side of the temporary substrate 5 while taking into account the surface topology of the first side 1 of the active layer 2. The bond between the first side 1 of the active layer 2 and the side of the temporary substrate 5 is, for example, a direct bond. By way of example, the temporary substrate 5 may be made of germanium, silicon, silicon dioxide, silicon carbide, gallium arsenide or quartz.

Direct bonding is a well-known technique. The principle of this type of bonding is based on bringing two surfaces into direct contact, i.e., without use of a specific bonding material (adhesive, wax, solder, etc.) between the two surfaces. Such an operation requires the surfaces to be bonded to be, at least in part, sufficiently planar, free from particles or contamination, and for the surfaces to be brought sufficiently close to one another to allow a contact to be initiated, this typically occurring at a distance smaller than a few nanometers. In this case, the attractive forces between the two surfaces are high enough to generate a direct bond (bonding induced by the sum total of attractive Van Der Waals forces, which are electronic interactions between atoms or molecules of the two surfaces to be bonded).

Thus, such a bond cannot be obtained unless the first side 1 of the active layer 2 or/and the side of the temporary substrate 5 are modified so that these sides 1, 5 to be bonded are, at least in part, planar enough and exempt from particles or contamination. In the present case, only the side of the temporary substrate 5 will be modified.

Thus, the transferring process of the present disclosure includes producing, on the side of the temporary substrate 5, a surface topology complementary to the surface topology of the first side 1 of the active layer 2, such that the surface topology of the temporary substrate 5 encapsulates the surface topology of the first side 1 of the active layer 2 in the first bonding step, without the electrical components 3, placed on the first side 1 of the active layer 2, making contact with the temporary substrate 5.

Figure 2:
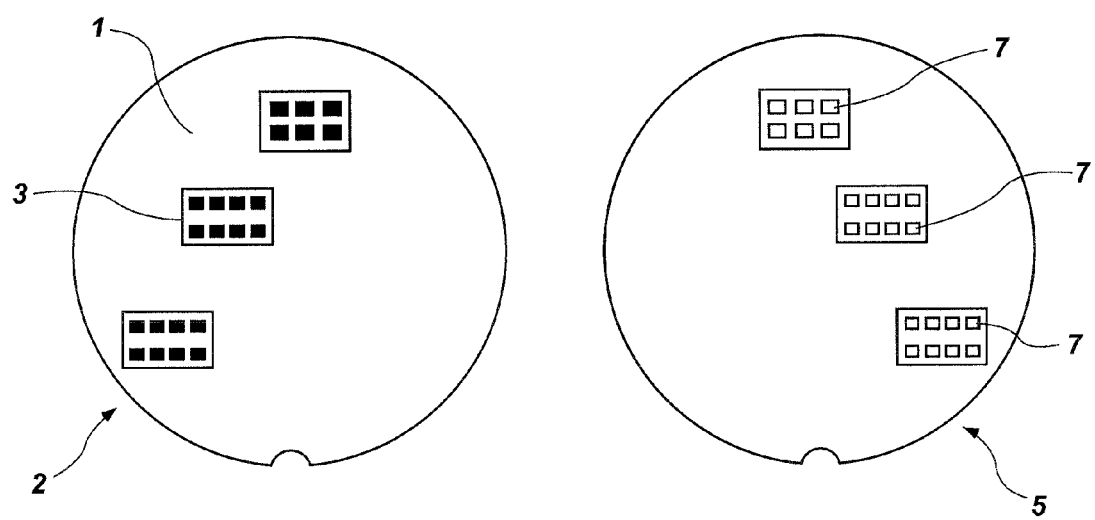
FIG. 2 is a schematic representation of one side of another active layer and of one side of a temporary substrate according to the present disclosure.

To do this, a map of the surface topology of the first side 1 of the active layer 2 may be produced so as to gather data relating to the geometry and dimensions of the electrical components 3 placed on this first side 1 of the active layer 2, as illustrated in FIG. 2. The complementary surface topology may then be produced by etching, of the temporary substrate 5, thus forming cavities 7, reproducing the geometry and dimensions determined beforehand. This operation may be carried out by any type of known prior-art etching process, such as wet etching or reactive ion etching (RIE), but also, for example, using a laser, or any other solution suitable for the material of the temporary substrate 5.

Moreover, in order for the surface topology of the temporary substrate 5 to encapsulate the surface topology of the first side 1 of the active layer 2 without the electrical components 3 making contact with the temporary substrate 5, the dimensions used to produce the complementary surface topology of the temporary substrate 5 may be increased by at least 5% relative to the dimensions of the electrical components 3 placed on the first side 1 of the active layer 2.

Thus, the thickness of the temporary substrate 5 may be larger than the maximum height h of the surface topology of the first side 1 of the active layer 2 by at least 5%.

Figure 4:
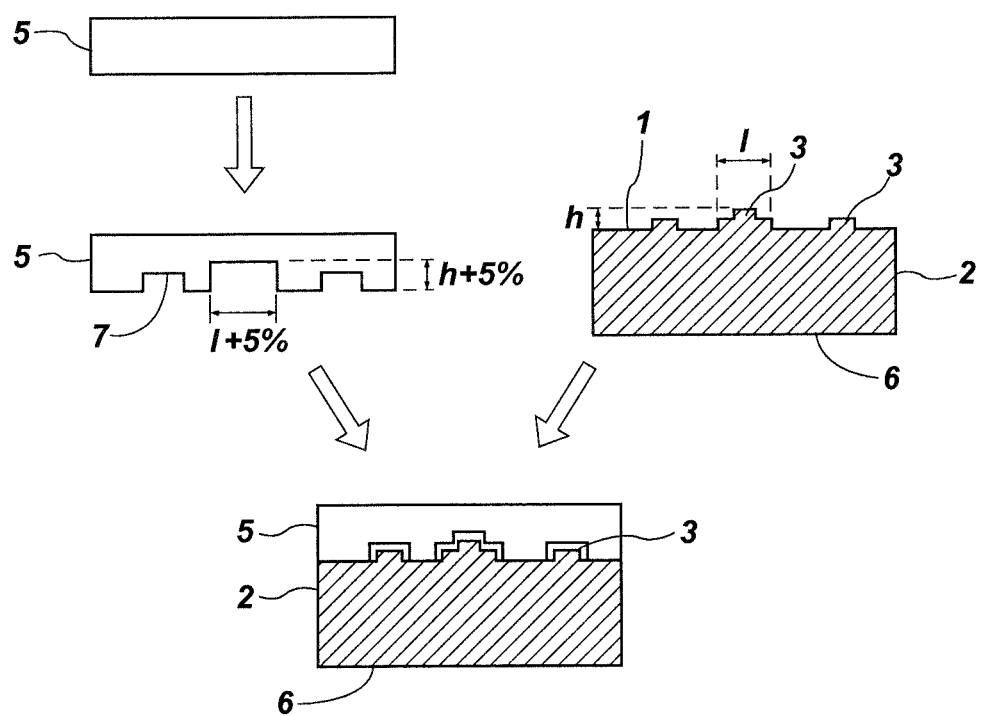
FIG. 4 is a partial schematic representation of another embodiment of the transferring process according to the present disclosure.

The surface topology of the temporary substrate 5 may be produced, either, so as to closely match the surface topology of the first side 1 of the active layer 2 by reproducing the geometry and dimensions, increased by 5%, of the electrical components 3 placed on the first side 1 of the active layer 2, as seen above and such as illustrated in FIG. 3, or, alternatively, by producing cavities 7, for example, of rectangular shape, the depth and width of which correspond to the maximum height h and maximum width 1, at least increased by 5%, of the electrical components 3, such as illustrated in FIG. 4.

In the first step of direct bonding the first side 1 of the active layer 2 to the side of the temporary substrate 5, the first side 1 of the active layer 2 is bonded only on the planar portions of the first side 1. To obtain a bonding force high enough to allow the active layer 2 to be handled and transferred, the area of the planar portion of the first side 1 of the active layer 2, i.e., the area that is bonded, may be larger than the area of the nonplanar portion. Thus, the area of bonding between the first side 1 of the active layer 2 and the side of the temporary substrate 5 may represent at least 50% of the total area of the first side 1 of the active layer 2. In other words, the planar zone of the first side 1 of the active layer 2 to which the side of the temporary substrate 5 is bonded may be larger than the nonplanar zone of the first side 1 of the active layer 2.

Depending on the size of the area of bonding between the first side 1 of the active layer 2 and the side of the temporary substrate 5, a stabilizing and/or reinforcing heat treatment may also be necessary to improve the bond, so as to obtain a bonding energy of at least 700 mJ/m$^2$. In this case, and to prevent the electrical components 3 from being damaged, the temperature of the heat treatment may be maintained below 500° C.

Once the first bonding step has been carried out, the second side 6 of the active layer 2 is bonded, for example, by direct bonding, to one side of the final substrate 4 in a second bonding step.

Depending on the embodiment, a step of thinning may be carried out, between the first and second steps, on the second side 6 of the active layer 2, for example, by mechanical polishing or any other technique suitable for the material of the active layer 2, so as to obtain an active layer 2 having a thickness of between 2 μm and 10 μm.

Lastly, in a third step, the temporary substrate 5 and the active layer 2 may be separated, so as to obtain a desired structure including the active layer 2 and the final substrate 4. There are many known processes allowing a layer to be separated from a substrate. As a non-limiting example, the substrate 5 and the layer 2 may be separated by inserting a blade between the temporary substrate 5 and the active layer 2. Given that the first step of bonding the first side 1 of the active layer 2 to the side of the temporary substrate 5 is not carried out on the entirety of these two sides, the separation of the temporary substrate 5 and of the active layer 2, in the third step, may be facilitated.

Thus, the transfer process according to the present disclosure allows an active layer having a non-planar, three-dimensional surface topology to be transferred without the layer having to be treated, thus preventing or reducing contamination and/or stress, while protecting the electrical components during the transfer process. Moreover, the temporary substrate may be reused to transfer layers having a side, the surface topology of which is compatible with that of the temporary substrate.

Additional non-limiting embodiments of the disclosure are set forth below.

Embodiment 1

A process for transferring an active layer to a final substrate using a temporary substrate, the active layer having a first side having a three-dimensional surface topology, the process comprising: a first step of bonding the first side of the active layer having the three-dimensional surface topology to one side of the temporary substrate, the one side of the temporary substrate having a three-dimensional surface topology complementary to the surface topology of the first side of the active layer such that the surface topology of the temporary substrate encapsulates the surface topology of the first side of the active layer; a second step of bonding a second side of the active layer to the final substrate; and a third step of separating the active layer and the temporary substrate.

Embodiment 2

The process of Embodiment 1, further comprising etching the one side of the temporary substrate and producing the three-dimensional surface topology of the one side of the temporary substrate, the three-dimensional surface topology including features having predefined geometries and dimensions.

Embodiment 3

The process of Embodiment 2, wherein the predefined geometries and dimensions correspond to geometries and dimensions of features of the surface topology of the first side of the active layer.

Embodiment 4

The process of Embodiment 2 or Embodiment 3, wherein at least one dimension of the features of the three-dimensional surface topology of the one side of the temporary substrate is greater than a corresponding dimension of the features of the surface topology of the first side of the active layer by at least 5% of the corresponding dimension.

Embodiment 5

The process of any one of Embodiments 2 through 4, wherein the etching of the one side of the temporary substrate forms a cavity having a depth greater than a maximum height of a corresponding feature of the surface topology of the first side of the active layer by at least 5% of the maximum height, the cavity having a width greater than a maximum width of the corresponding feature by at least 5% of the maximum width.

Embodiment 6

The process of any one of Embodiments 1 through 5, further comprising thinning the active layer by removing material from the second side of the active layer after the first step and before the second step.

Embodiment 7

The process of any one of Embodiments 1 through 6, wherein the three-dimensional surface topology of the first side of the active layer comprises at least one planar portion and at least one nonplanar portion.

Embodiment 8

The process of Embodiment 7, wherein only the planar portion of the first side of the active layer is bonded to the one side of the temporary substrate when the first side of the active layer is bonded to the one side of the temporary substrate.

Embodiment 9

The process of Embodiment 8, wherein the area of the planar portion of the first side of the active layer is larger than the area of the nonplanar portion.

Embodiment 10

The process of Embodiment 7, wherein the area of the planar portion of the first side of the active layer is larger than the area of the nonplanar portion.

Embodiment 11

The process of any one of Embodiments 1 through 10, wherein the bonding of the first side of the active layer to the one side of the temporary substrate comprises a direct bonding process.

Embodiment 12

The process of Embodiment 11, wherein the bonding of the first side of the active layer to the one side of the temporary substrate further comprises, after the direct bonding process, a reinforcing heat treatment performed at a temperature maintained below 500° C.

Embodiment 13

A process for transferring an active layer to a final substrate using a temporary substrate, the active layer having a first side having a three-dimensional surface topology including protruding regions protruding outward from a planar surface of the first side of the active layer, the process comprising: bonding the first side of the active layer having the three-dimensional surface topology to one side of the temporary substrate, the one side of the temporary substrate having a three-dimensional surface topology including recesses extending into a planar surface of the one side of the temporary substrate, such that the protruding regions of the first side of the active layer are disposed within the recesses of the one side of the temporary substrate, and such that the planar surface of the first side of the active layer is bonded to the planar surface of the one side of the temporary substrate; bonding a second side of the active layer to the final substrate after bonding the first side of the active layer to the one side of the temporary substrate; and separating the active layer and the temporary substrate after bonding the second side of the active layer to the final substrate.

Embodiment 14

The process of Embodiment 13, further comprising forming the recesses extending into the planar surface of the one side of the temporary substrate using an etching process.

Embodiment 15

The process of Embodiment 13 or Embodiment 14, wherein at least one dimension of the recesses of the temporary substrate is greater than a corresponding dimension of the protruding regions of the active layer by at least 5% of the corresponding dimension.

Embodiment 16

The process of any one of Embodiments 13 through 15, further comprising thinning the active layer by removing material from the second side of the active layer while the active layer is bonded to the temporary substrate.

Embodiment 17

The process of any one of Embodiments 13 through 16, wherein the protruding regions of the active layer do not touch any surface of the temporary substrate while the active layer is bonded to the temporary substrate.

Embodiment 18

The process of any one of Embodiments 13 through 17, wherein an area of the planar surface of the first side of the active layer is larger than an area of the first side of the active layer occupied by the protruding regions.

Embodiment 19

The process of any one of Embodiments 13 through 18, wherein the bonding of the first side of the active layer to the one side of the temporary substrate comprises a direct bonding process.

Embodiment 20

The process of Embodiment 19, wherein the bonding of the first side of the active layer to the one side of the temporary substrate further comprises, after the direct bonding process, a reinforcing heat treatment performed at a temperature maintained below 500° C.

While certain illustrative embodiments have been described in connection with the figures, those of ordinary skill in the art will recognize and appreciate that the scope of this disclosure is not limited to those embodiments explicitly shown and described herein. Rather, many additions, deletions, and modifications to the embodiments described herein may be made to produce embodiments within the scope of this disclosure, such as those hereinafter claimed, including legal equivalents. In addition, features from one disclosed embodiment may be combined with features of another disclosed embodiment while still being within the scope of this disclosure, as contemplated by the inventors.

What is claimed is:

1. A process for transferring an active layer to a final substrate using a temporary substrate, the active layer having a first side having a three-dimensional surface topology, the process comprising:
    a first step of bonding the first side of the active layer having the three-dimensional surface topology to one side of the temporary substrate, the one side of the temporary substrate having a three-dimensional surface topology complementary to the surface topology of the first side of the active layer such that the surface topology of the temporary substrate encapsulates the surface topology of the first side of the active layer;
    a second step of bonding a second side of the active layer to the final substrate; and
    a third step of separating the active layer and the temporary substrate.

2. The process of claim 1, further comprising etching the one side of the temporary substrate and producing the three-dimensional surface topology of the one side of the temporary substrate, the three-dimensional surface topology including features having predefined geometries and dimensions.

3. The process of claim 2, wherein the predefined geometries and dimensions correspond to geometries and dimensions of features of the surface topology of the first side of the active layer.

4. The process of claim 3, wherein at least one dimension of the features of the three-dimensional surface topology of the one side of the temporary substrate is greater than a corresponding dimension of the features of the surface topology of the first side of the active layer by at least 5% of the corresponding dimension.

5. The process of claim 2, wherein the etching of the one side of the temporary substrate forms a cavity having a depth greater than a maximum height of a corresponding feature of the surface topology of the first side of the active layer by at least 5% of the maximum height, the cavity having a width greater than a maximum width of the corresponding feature by at least 5% of the maximum width.

6. The process of claim 1, further comprising thinning the active layer by removing material from the second side of the active layer after the first step and before the second step.

7. The process of claim 1, wherein the three-dimensional surface topology of the first side of the active layer comprises at least one planar portion and at least one nonplanar portion.

8. The process of claim 7, wherein only the planar portion of the first side of the active layer is bonded to the side of the temporary substrate when the first side of the active layer is bonded to the one side of the temporary substrate.

9. The process of claim 8, wherein the area of the planar portion of the first side of the active layer is larger than the area of the nonplanar portion.

10. The process of claim 7, wherein the area of the planar portion of the first side of the active layer is larger than the area of the nonplanar portion.

11. The process of claim 1, wherein the bonding of the first side of the active layer to the one side of the temporary substrate comprises a direct bonding process.

12. The process of claim 11, wherein the bonding of the first side of the active layer to the one side of the temporary substrate further comprises, after the direct bonding process, a reinforcing heat treatment performed at a temperature maintained below 500° C.

13. A process for transferring an active layer to a final substrate using a temporary substrate, the active layer having a first side having a three-dimensional surface topology including protruding regions protruding outward from a planar surface of the first side of the active layer, the process comprising:

bonding the first side of the active layer having the three-dimensional surface topology to one side of the temporary substrate, the one side of the temporary substrate having a three-dimensional surface topology including recesses extending into a planar surface of the one side of the temporary substrate, such that the protruding regions of the first side of the active layer are disposed within the recesses of the one side of the temporary substrate, and such that the planar surface of the first side of the active layer is bonded to the planar surface of the one side of the temporary substrate;

bonding a second side of the active layer to the final substrate after bonding the first side of the active layer to the one side of the temporary substrate; and separating the active layer and the temporary substrate after bonding the second side of the active layer to the final substrate.

14. The process of claim 13, further comprising forming the recesses extending into the planar surface of the one side of the temporary substrate using an etching process.

15. The process of claim 13, wherein at least one dimension of the recesses of the temporary substrate is greater than a corresponding dimension of the protruding regions of the active layer by at least 5% of the corresponding dimension.

16. The process of claim 13, further comprising thinning the active layer by removing material from the second side of the active layer while the active layer is bonded to the temporary substrate.

17. The process of claim 13, wherein the protruding regions of the active layer do not touch any surface of the temporary substrate while the active layer is bonded to the temporary substrate.

18. The process of claim 13, wherein an area of the planar surface of the first side of the active layer is larger than an area of the first side of the active layer occupied by the protruding regions.

19. The process of claim 13, wherein the bonding of the first side of the active layer to the one side of the temporary substrate comprises a direct bonding process.

20. The process of claim 19, wherein the bonding of the first side of the active layer to the one side of the temporary substrate further comprises, after the direct bonding process, a reinforcing heat treatment performed at a temperature maintained below 500° C.

* * * * *